United States Patent
Ozaki et al.

(10) Patent No.: US 8,796,793 B2
(45) Date of Patent: Aug. 5, 2014

(54) MAGNETORESISTIVE ELEMENT, MAGNETIC RANDOM ACCESS MEMORY AND METHOD OF MANUFACTURING THE SAME

(75) Inventors: Yasuaki Ozaki, Kanagawa (JP); Hiroaki Honjyou, Tokyo (JP)

(73) Assignees: Renesas Electronics Corporation, Kawasaki-shi, Kanagawa (JP); NEC Corporation, Tokyo (JP)

( * ) Notice: Subject to any disclaimer, the term of this patent is extended or adjusted under 35 U.S.C. 154(b) by 371 days.

(21) Appl. No.: 12/659,273

(22) Filed: Mar. 2, 2010

(65) Prior Publication Data

US 2010/0230769 A1    Sep. 16, 2010

(30) Foreign Application Priority Data

Mar. 3, 2009 (JP) ................. 2009-049757

(51) Int. Cl.
*H01L 29/82* (2006.01)
*H01L 43/00* (2006.01)

(52) U.S. Cl.
USPC ............ 257/421; 257/295; 257/E29.323; 257/E27.006; 257/E27.108

(58) Field of Classification Search
USPC ............ 257/421, 295, E29.323, E27.006, 257/E27.108; 438/296; 365/173
See application file for complete search history.

(56) References Cited

U.S. PATENT DOCUMENTS

| | | | |
|---|---|---|---|
| 7,948,044 B2 * | 5/2011 | Horng et al. | 257/421 |
| 8,040,724 B2 | 10/2011 | Suzuki et al. | |
| 2002/0097537 A1 * | 7/2002 | Shimazawa | 360/324.2 |
| 2004/0127054 A1 | 7/2004 | Lee et al. | |
| 2008/0204946 A1 | 8/2008 | Ochiai et al. | |
| 2009/0154231 A1 * | 6/2009 | Katou | 365/173 |

FOREIGN PATENT DOCUMENTS

| | | | | |
|---|---|---|---|---|
| JP | 2004-179250 | | 6/2004 | |
| JP | 2004-213744 A | | 7/2004 | |
| JP | 2004-214600 | | 7/2004 | |
| JP | 2007-317895 A | | 12/2007 | |
| JP | 2008-211008 A | | 9/2008 | |
| JP | 2008-226919 A | | 9/2008 | |
| JP | 2008-243991 A | | 10/2008 | |
| WO | WO 2007040189 A1 * | 4/2007 | | G11C 11/15 |
| WO | WO2009/019947 A1 | | 2/2009 | |

OTHER PUBLICATIONS

Japanese Office Action dated Jul. 4, 2012 with English Translation.

* cited by examiner

*Primary Examiner* — Thien F Tran
(74) *Attorney, Agent, or Firm* — McGinn IP Law Group, PLLC

(57) ABSTRACT

A magnetoresistive element includes: a lower magnetic layer; a barrier layer; and an upper magnetic layer. The barrier layer is provided on the lower magnetic layer. The upper magnetic layer is provided on the barrier layer. One of magnetization directions of the lower magnetic layer and the upper magnetic layer is fixed. The barrier layer has a first surface which includes a surface contacted with an upper surface of the lower magnetic layer. The upper magnetic layer has a second surface which includes a surface contacted with an upper surface of the barrier layer. Each of the first surface and the second surface is larger than the upper surface of the lower magnetic layer in area.

14 Claims, 10 Drawing Sheets

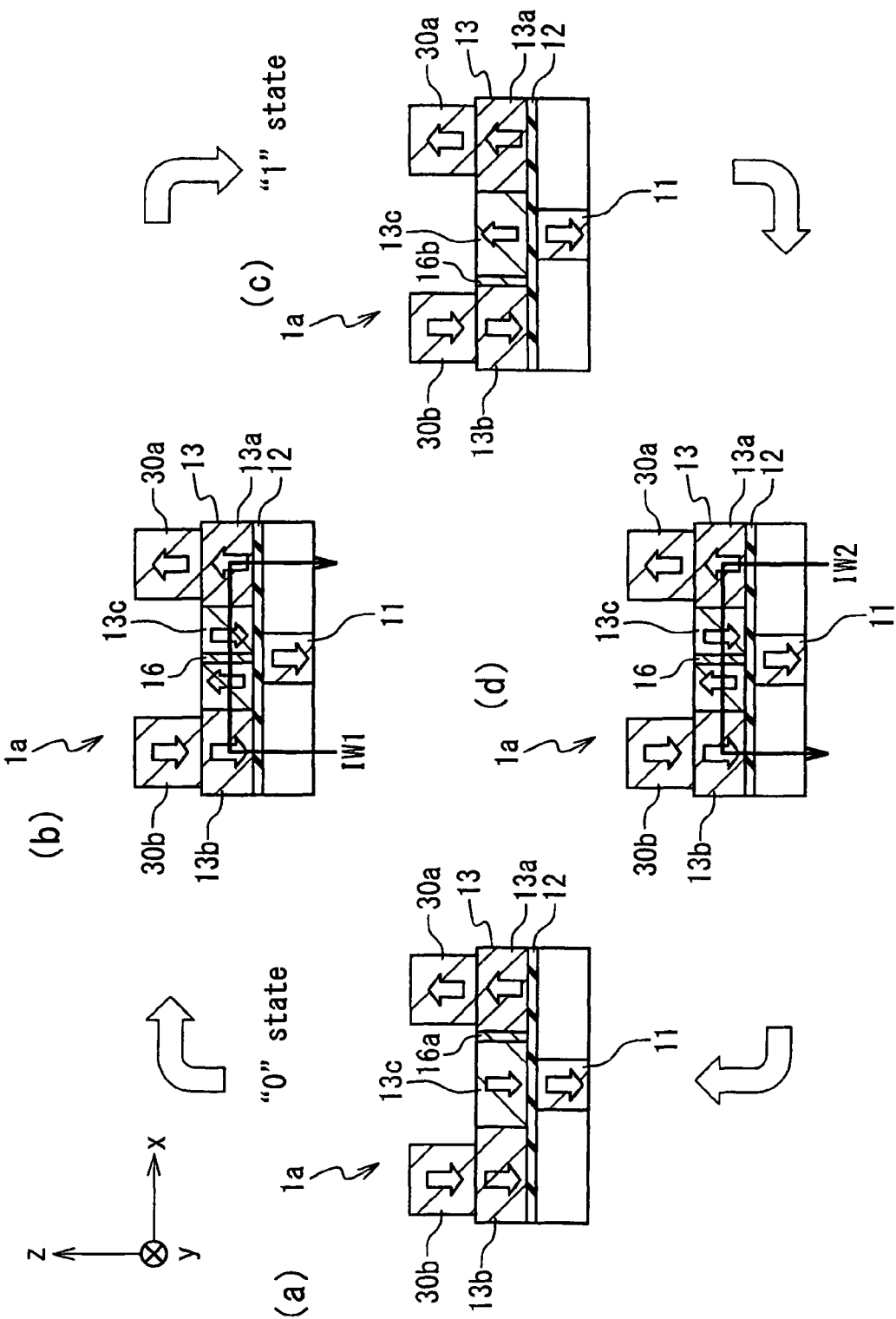

US 8,796,793 B2

MAGNETORESISTIVE ELEMENT, MAGNETIC RANDOM ACCESS MEMORY AND METHOD OF MANUFACTURING THE SAME

INCORPORATION BY REFERENCE

This application is based upon and claims the benefit of priority from Japanese patent application No. 2009-049757 filed on Mar. 3, 2009, the disclosure of which is incorporated herein in its entirety by reference.

BACKGROUND OF THE INVENTION

1. Field of the Invention

The present invention relates to a magnetoresistive element, a magnetic random access memory and a method of manufacturing them.

2. Description of Related Art

A magnetic random access memory (MRAM) has been expected as a nonvolatile memory capable of performing rewriting an infinite number of times with a high speed and actively developed. The MRAM uses a magnetoresistive element as a memory cell. An example of the magnetoresistive element is a TMR (Tunneling Magneto Resistive) element having magnetic tunneling junction (MTJ). The MTJ is composed of a free layer whose magnetization can be switched, a pinned layer whose magnetization is pinned, and a barrier layer provided between the pin layer and the free layer. The magnetoresistive element stores data as a magnetization direction of the free layer.

As a method of manufacturing of the magnetoresistive element, for example, Japanese Patent Publication JP2004-179250β discloses a method of manufacturing a magnetic tunneling junction element and a magnetic tunneling junction device. FIGS. 1 and 2 are sectional views showing the method of manufacturing the magnetic tunneling junction element described in JP2004-179250A. According to the method of manufacturing the magnetic tunneling junction element, first, a laminated layer including a first conductive material layer 124, a antiferromagnetic layer 126, a first ferromagnetic layer 128, a tunnel barrier layer 130, a second ferromagnetic layer 132 and a second conductive material layer 134 from the bottom is formed on an insulating film 122 which covers a substrate 120. Next, the second conductive material layer 134 is selectively etched using a resist layer 136 to form a first hard mask 134 (FIG. 1). Subsequently, the laminated layer is etched up to the antiferromagnetic layer 126 by ion milling using the first hard mask 134 as a selection mask to form a separation groove 138 (FIG. 2). At this time, a deposit DP adheres to a side surface of a magnetic tunnel junction part AT, namely, a side wall of the groove 138. Thus, the deposit DP adhering to the side wall of the groove 138 is removed by chemical treatment and then, the side wall is protected with a second hard mask made of an insulating material, and further, the separation groove is made deeper by ion milling to obtain the magnetic tunneling junction element.

As another method of manufacturing the magnetoresistive element, for example, Japanese Patent Publication JP2004-214600A (corresponding US Patent application: US2004127054 (A1)) discloses a method of forming a magnetic RAM. FIGS. 3 and 4 are sectional views showing the method of forming the magnetic RAM described in JP2004-214600A. According to the method of forming the magnetic RAM, first, a connecting metal layer 143 connected to a semiconductor substrate via a lower insulating layer 141 is formed. Next, a pinned magnetization layer 145, a tunnel barrier layer 147 and a free magnetization layer 149 are laminated on the connecting metal layer 143. Subsequently, a hard mask layer 151 is formed on the free magnetization layer 149. Then, the hard mask layer 151 and the free magnetization layer 149 are etched in a photolithographic etching step using an MTJ cell mask to make the tunnel barrier layer 147 exposed. Subsequently, a blocking layer 155 and an insulating film 157 are sequentially formed on the whole surface. Then, the insulating film 157 is anisotropically etched to form an insulating film spacer 157 on side walls of the hard mask layer 151 and the free magnetization layer 149 (FIG. 3). After that, using the insulating film spacer 157 and the hard mask layer 151 as masks, the tunnel barrier layer 147, the fixed magnetization layer 145 and the connecting metal layer 143 are etched to form the MTJ cell and the connecting layer 143 (FIG. 4).

We have now discovered the following facts.

As described above, according to the method described in JP2004-179250A, when the separation groove 138 is formed by ion milling (FIG. 2), the conductive deposit DP adheres to the side surface of the magnetic tunnel junction part AT, namely, the side surface of the barrier layer (tunnel barrier layer 130). For this reason, a short-circuit occurs between the upper magnetic layer (second ferromagnetic layer 132) and the lower magnetic layer (first ferromagnetic layer 128). In order to avoid the short-circuit, this method requires the step of removing the deposit DP by chemical treatment. In addition, in order to prevent adhesion of the deposit by subsequent ion milling, it is need to form a second hard mask for protecting the side surface of the magnetic tunnel junction part AT and perform additional ion milling.

According to the method described in JP2004-214600A, the above-mentioned adhesion of the deposit to a side surface of a barrier layer can be prevented. That is, first, only the upper magnetic layer (free magnetization layer 147) is etched and shaped and then, its side surface is covered with the blocking layer 155 and the insulating film spacer 157 (FIG. 3). After that, the barrier layer (tunnel barrier layer 147) and the lower magnetic layer (pinned magnetization layer 145) are separately shaped by etching to form the MTJ cell (FIG. 4). Thus, even when the deposit adheres to the side surface of the barrier layer, the blocking layer 155 and the insulating film spacer 157 prevent the short-circuit from occurring between the upper magnetic layer and the lower magnetic layer. However, according to this method, the barrier layer needs to be used as a stopper layer in etching. The barrier layer is generally a very thin film having a thickness of a few nm. For this reason, when a plurality of magnetoresistive elements are manufactured, for example, for MRAM, it may not easy to stop etching at an upper surface of the barrier layer in all of the magnetoresistive elements. As a result, manufacturing yield may lower.

SUMMARY

The present invention seeks to solve one or more of the above problems, or to improve upon those problems at least in part.

In one embodiment, a magnetoresistive element includes: a lower magnetic layer; a barrier layer configured to be provided on the lower magnetic layer; and an upper magnetic layer configured to be provided on the barrier layer, wherein one of magnetization directions of the lower magnetic layer and the upper magnetic layer is fixed, wherein the barrier layer has a first surface which includes a surface contacted with an upper surface of the lower magnetic layer, wherein the upper magnetic layer has a second surface which includes a surface contacted with an upper surface of the barrier layer, and wherein each of the first surface and the second surface is larger than the upper surface of the lower magnetic layer in area.

In another embodiment, a magnetic random access memory includes: a plurality of memory cells configured to be provided in a matrix, wherein each of the plurality of memory cells includes: a magnetoresistive element, wherein the magnetoresistive element includes: a lower magnetic layer, a barrier layer configured to be provided on the lower magnetic layer, and an upper magnetic layer configured to be provided on the barrier layer, wherein one of magnetization directions of the lower magnetic layer and the upper magnetic layer is fixed, wherein the barrier layer has a first surface which includes a surface contacted with an upper surface of the lower magnetic layer, wherein the upper magnetic layer has a second surface which includes a surface contacted with an upper surface of the barrier layer, and wherein each of the first surface and the second surface is larger than the upper surface of the lower magnetic layer in area.

In another embodiment, a method of manufacturing a magnetoresistive element includes: providing a lower magnetic layer embedded in an interlayer insulating layer; laminating a barrier layer and an upper magnetic layer in turn so as to cover the lower magnetic layer and a part of the interlayer insulating layer, the barrier layer having a first surface contacted with an upper surface of the lower magnetic layer, and the upper magnetic layer having a second surface contacted with an upper surface of the barrier layer; and etching the barrier layer and the upper magnetic layer such that each of the first surface and the second surface is larger than an upper surface of the lower magnetic layer in area.

In another embodiment, a method of manufacturing a magnetic random access memory includes: manufacturing a plurality of memory cells provided in a matrix, wherein the manufacturing step includes: providing a lower magnetic layer embedded in an interlayer insulating layer, laminating a barrier layer and an upper magnetic layer in turn so as to cover the lower magnetic layer and a part of the interlayer insulating layer, the barrier layer having a first surface contacted with an upper surface of the lower magnetic layer, and the upper magnetic layer having a second surface contacted with an upper surface of the barrier layer, and etching the barrier layer and the upper magnetic layer such that each of the first surface and the second surface is larger than an upper surface of the lower magnetic layer in area.

According to the present invention, a magnetoresistive element and an MRAM which have high reliability and yield can be provided.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 8 is a sectional view showing a writing principle of data to the magnetoresistive element according to the second embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a magnetoresistive element, a magnetic random access memory and a method of manufacturing them according to the present invention will be described below referring to attached drawings.

First Embodiment

Figure 1:
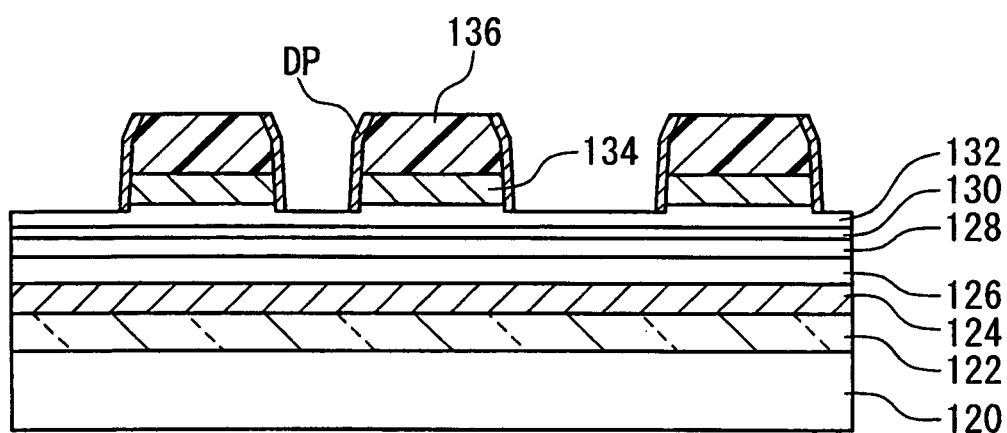
FIG. 1 is a sectional view showing a method of manufacturing a magnetic tunneling junction element described in JP2004-179250A.
Figure 2:
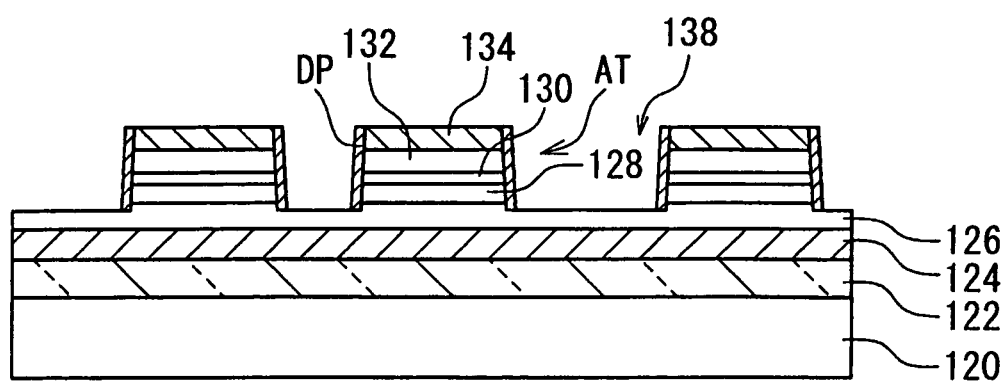
FIG. 2 is a sectional view showing the method of manufacturing the magnetic tunneling junction element described in JP2004-179250A.
Figure 3:
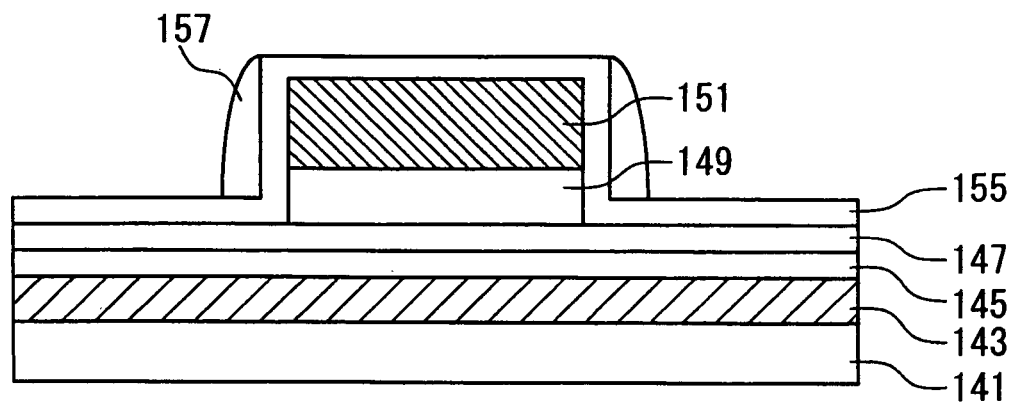
FIG. 3 is a sectional view showing a method of forming a magnetic RAM described in JP2004-214600A.
Figure 4:
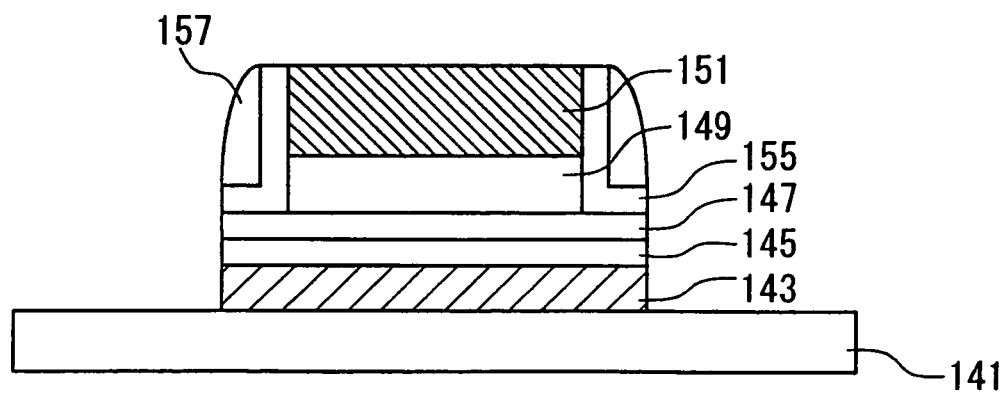
FIG. 4 is a sectional view showing the method of forming the magnetic RAM described in JP2004-214600A.
Figure 5A:
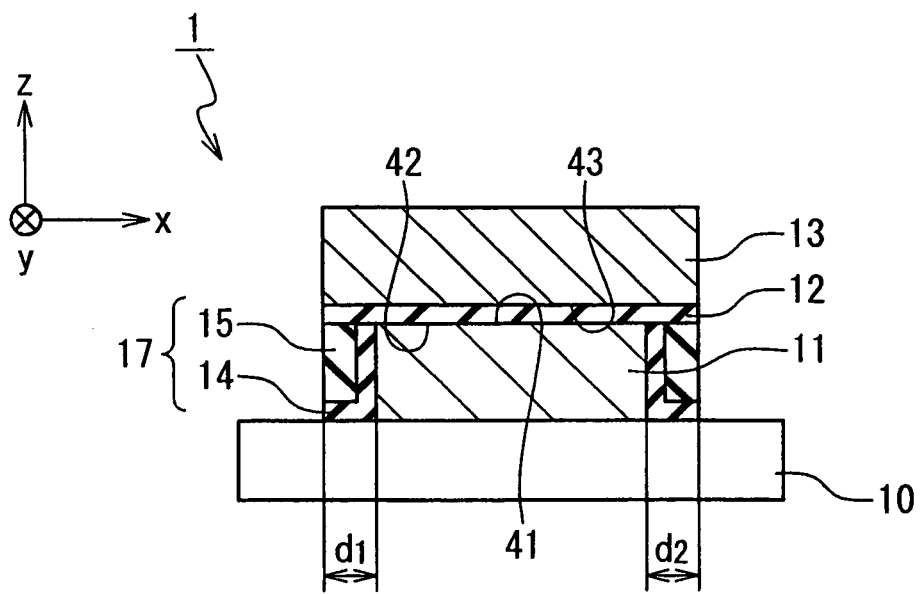
FIG. 5A is a sectional view showing a configuration of a magnetoresistive element according to a first embodiment of the present invention.
Figure 5B:
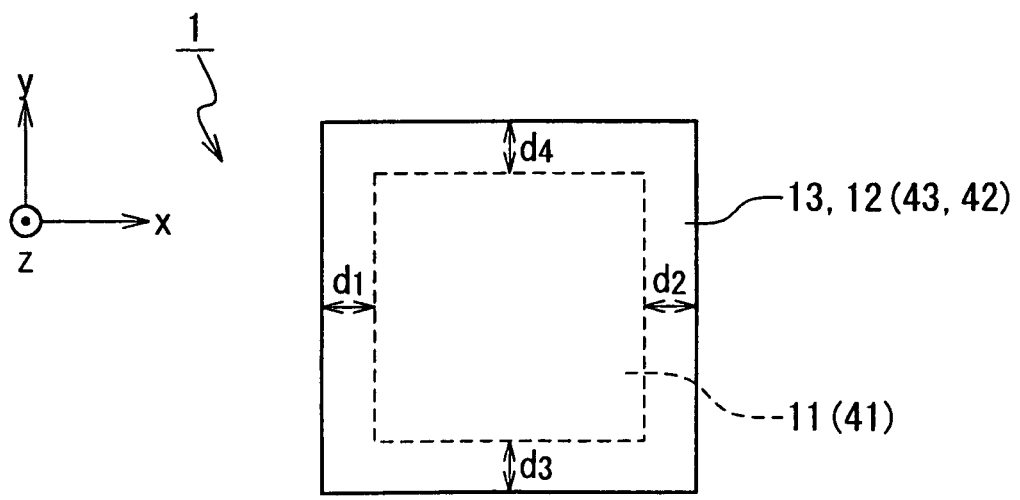
FIG. 5B is a sectional view showing a configuration of the magnetoresistive element according to the first embodiment of the present invention.

A configuration of a magnetoresistive element according to a first embodiment of the present invention will be described. FIG. 5A is a sectional view showing the configuration of the magnetoresistive element according to the first embodiment of the present invention. FIG. 5B is a top view showing the configuration of the magnetoresistive element according to the first embodiment of the present invention. The magnetoresistive element 1 includes a lower magnetic layer 11, a barrier layer 12 and an upper magnetic layer 13. Here, the case where xy planar shape of each layer is rectangular is described as an example. However, the present invention is not limited to this example and can be similarly applied to other shapes such as circle and ellipse.

The lower magnetic layer 11 is embedded in an interlayer insulating layer 17 on a substrate 10. Here, an example of the interlayer insulating layer 17 is a laminated layer of a nitride film 14 such as a SiN film and an oxide film 15 such as a SiO2 film. The nitride film 14 is formed on at least a side surface of the lower magnetic layer 11 as a sidewall, thereby suppressing a short-circuit between the lower magnetic layer 11 and the upper magnetic layer 13. Other part of the interlayer insulating layer 17 is filled with the oxide film 15. On the substrate 10, wiring lines, electric elements and an interlayer insulating layer may be provided. The lower magnetic layer 11 is a ferromagnetic layer having in-plane magnetic anisotropy (in-xy plane direction) or perpendicular magnetic anisotropy (z direction). The lower magnetic layer 11 may have a synthetic ferrimagnetic layer in which a plurality of ferromagnetic layers is laminated via at least one nonmagnetic layer. The barrier layer 12 is a nonmagnetic or insulating film provided on the lower magnetic layer 11. The upper magnetic layer 13 provided on the barrier layer 12 is a ferromagnetic layer having in-plane magnetic anisotropy or perpendicular magnetic anisotropy. The upper magnetic layer 13 may have a synthetic ferrimagnetic layer. The magnetic anisotropy of the lower magnetic layer 11 is basically the same as that of the upper magnetic layer 13. The lower magnetic layer 11, the barrier layer 12 and the upper magnetic layer 13 form magnetic tunneling junction (MTJ).

The magnetization direction of one of the lower magnetic layer 11 and the upper magnetic layer 13 is fixed, while the magnetization direction of the other of the lower magnetic layer 11 and the upper magnetic layer 13 can vary (e.g. be reversed or switched). The magnetization of one of the lower magnetic layer 11 and the upper magnetic layer 13 is pinned, while the magnetization of the other of the lower magnetic layer 11 and the upper magnetic layer 13 can vary. The pinning of the magnetization can be achieved, for example, by using an antiferromagnetic layer (not shown) provided under the lower magnetic layer 11 or on the upper magnetic layer 13. In the magnetoresistive element 1, a value of electrical resistance between the lower magnetic layer 11 and the upper magnetic layer 13 varies depending on relative relationship between a magnetization direction of one magnetic layer with pinned magnetization and a magnetization direction of the other magnetic layer with variable magnetization. In other words, the resistance value becomes relatively low when both the magnetization directions are parallel to each other, while the resistance value becomes relatively high when both the magnetization directions are antiparallel to each other. For this reason, by assigning data "0" to the low resistance and data "1" to the high resistance, the magnetoresistive element 1 can store data.

Here, a first surface 42 represents a lower surface of the barrier layer 12A. The first surface 42 includes a surface contacted with an upper surface 41 of the lower magnetic layer 11 and is larger than the upper surface 41 in area.

A second surface 43 represents a lower surface of the upper magnetic layer 13. The second surface 43 includes a surface contacted with an upper surface of the barrier layer 12 and is larger than the upper surface 41 of the lower magnetic layer 11 in area.

In other words, when viewed from an upper surface (from +z direction), the barrier layer 12 and the upper magnetic layer 13 completely cover the lower magnetic layer 11 and are projected from the lower magnetic layer 11. Accordingly, for example, when the lower magnetic layer 11, the barrier layer 12 and the upper magnetic layer 13 are projected on the surface (xy plane) of the substrate 10, a projection of the lower magnetic layer 11 is included within projections of the barrier layer 12 and the upper magnetic layer 13. In an example shown in these drawings, the barrier layer 12 (the first surface 42: rectangular) and the upper magnetic layer 13 (the second surface 43: rectangular) are projected from the lower magnetic layer 11 (the upper surface 41: rectangular) by a length d1 in a −x direction, a length d2 in a +x direction, a length d3 in a −y direction and a length d4 in a +y direction. The projected portions are covered with the interlayer insulating layer 17 from the bottom. The lengths d1 to d4 (>0) are not necessarily uniform. That is, a periphery of an upper end of the lower magnetic layer 11 is away from a periphery of a lower end of the barrier layer 12.

In the present embodiment with such a configuration, an upper end of the lower magnetic layer 11 is separated from a lower end of the upper magnetic layer 13 not only by the barrier layer 12 but also with a certain distance (ex. d1, d2, d3, and d4). Accordingly, the distance substantially prevents electrical contact between the lower magnetic layer 11 and the upper magnetic layer 13. Further, in the actual element, as shown in the drawings, the upper end of the lower magnetic layer 11 is separated from the lower end of the upper magnetic layer 13 by the interlayer insulating layer 17 in addition to the barrier layer 12. Accordingly, even if a conductive deposit is formed on an outer surface of the barrier layer 12, the interlayer insulating layer 17 acts as a barrier and prevents electrical contact between the lower magnetic layer 11 and the upper magnetic layer 13. In other words, a short-circuit between the lower magnetic layer 11 and the upper magnetic layer 13 can be reliably prevented. Thereby, reliability of the magnetoresistive element 1 can be improved.

In the example shown in these drawings, an xy plane shape of the upper magnetic layer 13 is the same as that of the barrier layer 12 (the shape of the first surface 42 is the same as that of the second surface 43) and these layers overlap each other in the z direction. However, the present invention is not limited to this example. Both the first surface 42 of the barrier layer 12 and the second surface 43 of the upper magnetic layer 13 only need to be larger than the upper surface 41 of the lower magnetic layer 11 in area and project from the upper surface 41. For example, the xy plane shape of the upper magnetic layer 13 is not necessarily the same as or similar to that of the barrier layer 12, and the xy plane shape of the upper magnetic layer 13 may be larger than that of the barrier layer 12, and vice versa.

When the lower magnetic layer 11 and the upper magnetic layer 13 have the in-plane magnetic anisotropy, it is preferred that materials for the layers include at least one material selected from a group consisting of Fe, Co and Ni. By adding any of B, C, N, O, Al, Si, P, Ti, V, Cr, Mn, Cu, Zn, Zr, Nb, Mo, Tc, Ru, Rh, Ag, Hf, Ta, W, Re, Os, Ir, Au to the selected material, it can be adjusted so as to obtain a desired magnetic property. For example, Ni—Fe, Co—Fe, Fe—Co—Ni, Ni—Fe—Zr, Co—Fe—B and Co—Fe—Zr—B are applicable. Further, it is preferred that the barrier layer 12 is made of an insulating material. Specific examples are Mg—O, Al—O, Al—N, Ni—O and Hf—O. However, even when nonmagnetic materials such as a semiconductor material and a metal material are used as the material for the barrier layer 12, the present invention can be implemented. Specific examples are Cr, Al, Cu and Zn.

When the lower magnetic layer 11 and the upper magnetic layer 13 have the perpendicular magnetic anisotropy, it is preferred that materials for the layers include at least one material selected from a group consisting of Fe, Co and Ni. By adding Pt or Pd, the perpendicular magnetic anisotropy can be stabilized. By further adding any of B, C, N, O, Al, Si, P, Ti, V, Cr, Mn, Cu, Zn, Zr, Nb, Mo, Tc, Ru, Rh, Ag, Hf, Ta, W. Re, Os, Ir, Au and Sm, it can be adjusted so as to obtain a desired magnetic characteristic. For example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co and Gd—Tb—Fe—Co are applicable. Alternatively, by alternately laminating a layer containing one material selected from a group consisting of Fe, Co and Ni and a different layer, the perpendicular magnetic anisotropy can be revealed. An example is a laminated layer obtained by alternately laminating Co/Pd, Co/Pt, Co/Ni and Fe/Au.

A writing principle and a reading principle of a conventionally known TMR element having MTJ can be used as a writing principle and a reading principle of data with respect to the magnetoresistive element (memory cell). A MRAM using such the magnetoresistive element (memory cell) may adopt a configuration of a conventionally known MRAM in which the TMR element having MTJ is used as the memory cell.

Next, a method of manufacturing the magnetoresistive element according to the first embodiment of the present invention will be described. FIGS. 6A to 6H are sectional views showing the method of manufacturing the magneto resistive element according to the first embodiment of the present invention.

Figure 6A:
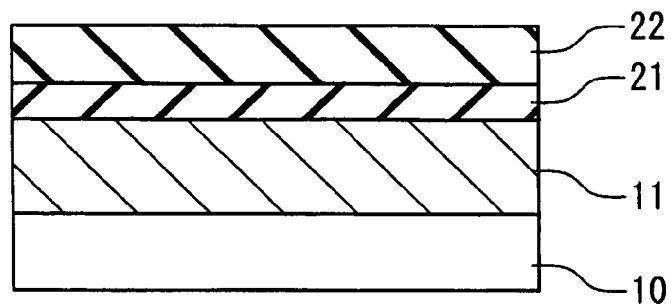
FIG. 6A is a sectional view showing a method of manufacturing the magnetoresistive element according to the first embodiment of the present invention.
Figure 6B:
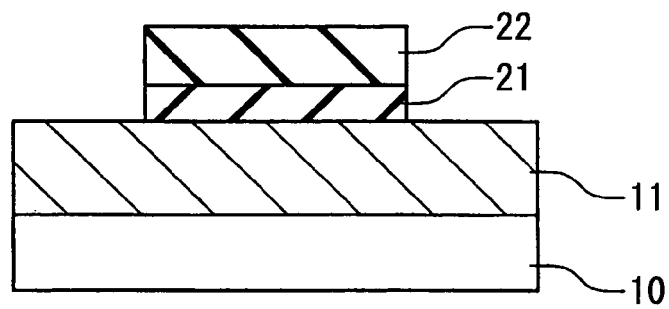
FIG. 6B is a sectional view showing the method of manufacturing the magnetoresistive element according to the first embodiment of the present invention.
Figure 6C:
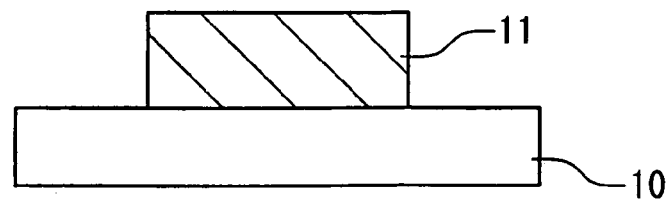
FIG. 6C is a sectional view showing the method of manufacturing the magnetoresistive element according to the first embodiment of the present invention.

As shown in FIG. 6A, the lower magnetic layer 11 and a nitride film 21 (ex. a SiN film) and an oxide film 22 (ex. a SiO2 film) as hard masks are laminated on the substrate 10 (on which electric elements, wiring lines and an interlayer insulating layer may be provided) in this order. Next, as shown in FIG. 6B, the nitride film 21 and the oxide film 22 as hard masks are etched into a desired pattern. This pattern is a pattern forming the shape of the lower magnetic layer 11. Subsequently, as shown in FIG. 6C, using the nitride film 21 and the oxide film 22 as masks, the lower magnetic layer 11 is milled (etched). Thereby, the lower magnetic layer 11 is shaped into a desired pattern. After that, the nitride film 21 and the oxide film 22 are removed by etching. As a result, the lower magnetic layer 11 with the desired pattern is exposed on the substrate 10.

Figure 6D:
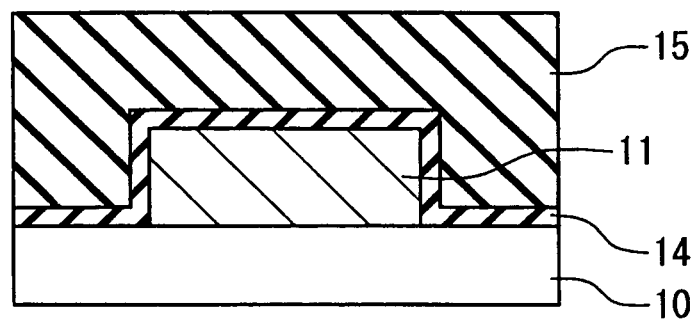
FIG. 6D is a sectional view showing the method of manufacturing the magnetoresistive element according to the first embodiment of the present invention.
Figure 6E:
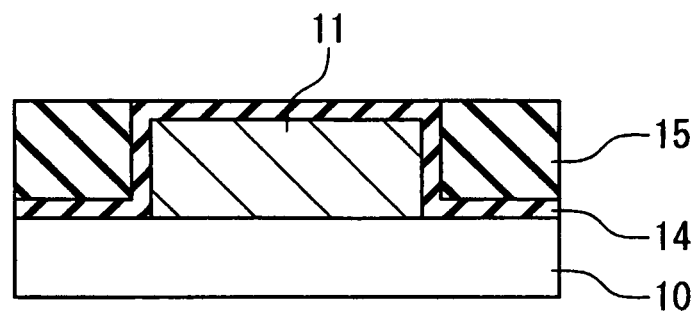
FIG. 6E is a sectional view showing the method of manufacturing the magnetoresistive element according to the first embodiment of the present invention.
Figure 6F:
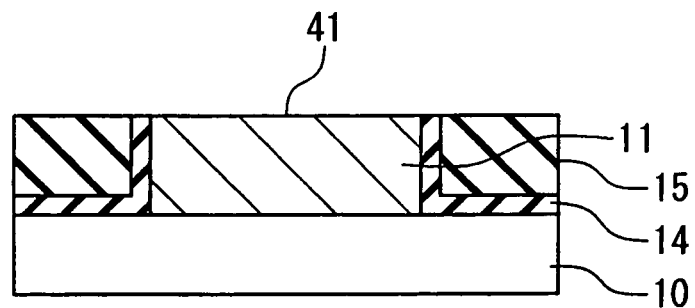
FIG. 6F is a sectional view showing the method of manufacturing the magnetoresistive element according to the first embodiment of the present invention.

Next, as shown in FIG. 6D, the nitride film 14 (ex. a SiN film) and the oxide film 15 (ex. a SiO2 film) as interlayer insulating layers are laminated in this order so as to cover the exposed lower magnetic layer 11 and substrate 10. Subsequently, as shown in FIG. 6E, the oxide film 15 is planarized by using a CMP (Chemical Mechanical Polishing) method. Thereby, the nitride film 14 covering the upper surface of the lower magnetic layer 11 is exposed. Then, as shown in FIG. 6F, the nitride film 14 and the oxide film 15 are etched back so that the upper surface 41 of the lower magnetic layer 11 is exposed (the top appears). As a result, the lower magnetic layer 11 embedded in the interlayer insulating layers (the nitride film 14 and the oxide film 15) is formed.

Figure 6G:
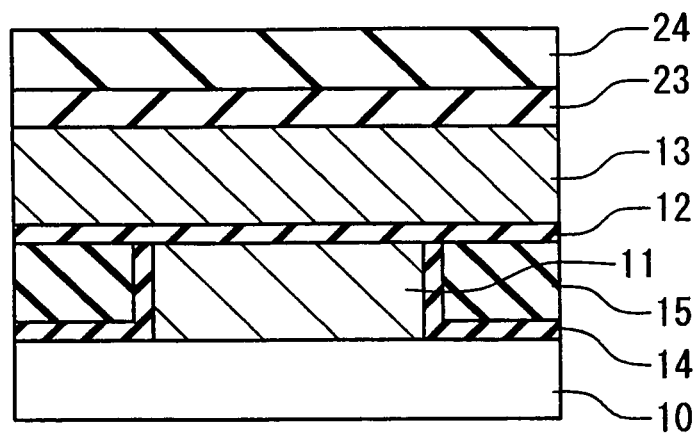
FIG. 6G is a sectional view showing the method of manufacturing the magnetoresistive element according to the first embodiment of the present invention.
Figure 6H:
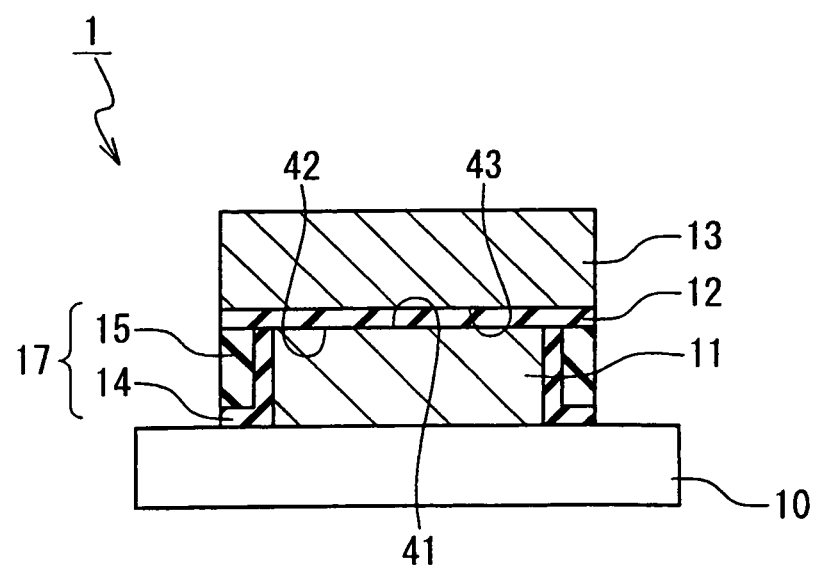
FIG. 6H is a sectional view showing the method of manufacturing the magnetoresistive element according to the first embodiment of the present invention.

Next, as shown in FIG. 6G, the barrier layer 12, the upper magnetic layer 13, a nitride film 23 (ex. a SiN film) and an oxide film 24 (ex. a SiO2 film) as hard masks are laminated in this order so as to cover the nitride film 14, the oxide film 15 and the lower magnetic layer 11 (the upper surface 41). Then, as shown in FIG. 6H, the nitride film 23 and the oxide film 24 as hard masks are etched into a desired pattern. This pattern is a pattern forming the shape of the upper magnetic layer 13 and the barrier layer 12. This pattern includes the pattern of the lower magnetic layer 11 inside and is set to be larger than the pattern of the lower magnetic layer 11. In other words, both a first surface 42 in contact with the upper surface 41 of the lower magnetic layer 11 in the barrier layer 12 and a second surface 43 in contact with the upper surface of the barrier layer 12 in the upper magnetic layer 13 are set to be larger than the upper surface 41 of the lower magnetic layer 11 in area. Subsequently, using the nitride film 23 and the oxide film 24 as masks, the upper magnetic layer 11 and the barrier layer 12 are milled (etched). Thereby, the upper magnetic layer 13 and the barrier layer 12 are shaped into a desired pattern. After that, the nitride film 23 and the oxide film 24 are removed by etching. As a result, the magnetoresistive element 1 of a desired shape is formed on the substrate 10.

In the above-mentioned method of manufacturing the magnetoresistive element, at the step of milling (etching) the upper magnetic layer 13 and the barrier layer 12 using the nitride film 23 and the oxide film 24 as masks, the barrier layer 12 and the upper magnetic layer 13 are etched into the same shape. However, the present embodiment is not limited to this example but the layers may be etched into different shape. For example, it can be realized by first forming the barrier layer 12 and milling (etching) it into a desired shape and then, forming the upper magnetic layer 13 and milling (etching) it into a desired shape.

In this manner, the magnetoresistive element according to the first embodiment of the present invention can be manufactured.

Further, by forming a plurality of magnetoresistive elements 1 in a matrix to form memory cells located in a matrix, the MRAM according to the first embodiment of the present invention can be manufactured. In this case, structures of the memory cell and the MRAM can adopt conventionally known configurations.

In the present embodiment, even when a conductive deposit (ex. the material for the upper magnetic layer 13) adheres to the side wall of the barrier layer 12 at milling (etching) of the upper magnetic layer 13 and the barrier layer 12, a lower end of the upper magnetic layer 13 is away from an upper end of the lower magnetic layer 11 and is separated from the lower magnetic layer 11 by the interlayer insulating layers (the nitride film 14 and the oxide film 15). For this reason, a short-circuit between the upper magnetic layer 13 and the lower magnetic layer 11 due to adhesion of the conductive deposit can be suppressed. Further, in the present embodiment, the barrier layer 12 is not used as a stopper layer for etching. Thus, the reliability of the barrier layer 12 cannot be lowered. Therefore, a yield and reliability of the magnetoresistive element 1 can be greatly improved.

Second Embodiment

Figure 7A:
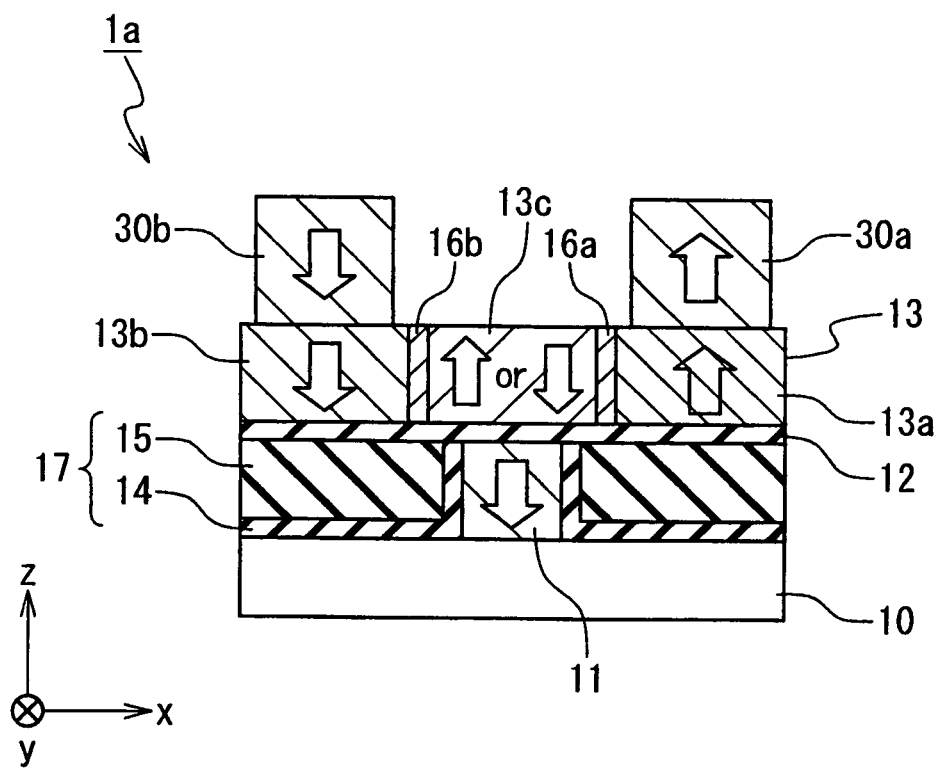
FIG. 7A is a sectional view showing a configuration of a magnetoresistive element according to a second embodiment of the present invention.
Figure 7B:
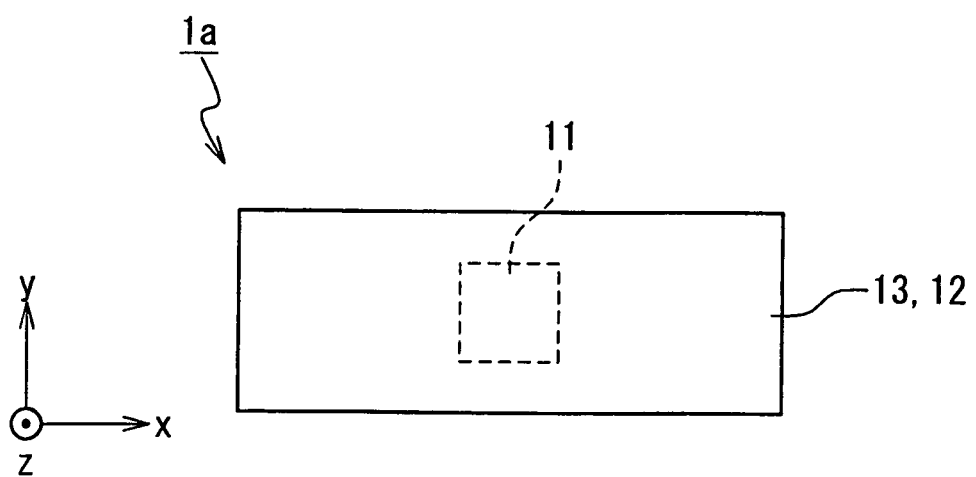
FIG. 7B is a top view showing the configuration of the magnetoresistive element according to the second embodiment of the present invention.

A configuration of a magnetoresistive element according to a second embodiment of the present invention will be described. FIG. 7A is a sectional view showing the configuration of the magnetoresistive element according to the second embodiment of the present invention. FIG. 7B is a top view showing the configuration of the magnetoresistive element according to the second embodiment of the present invention. This magnetoresistive element 1a is different from the magnetoresistive element 1 in the first embodiment in that the upper magnetic layer 13 is a domain wall motion type magnetization recording layer. In FIG. 7A, a white arrow represents a magnetization direction in each layer (the same is also applied below).

The upper magnetic layer 13 is a ferromagnetic layer having a perpendicular magnetic anisotropy and includes a first magnetization pinned region 13a, a second magnetization pinned region 13b and a magnetization switching region 13c. A magnetization direction of the first magnetization pinned region 13a is fixed to a first direction (+z direction). The magnetization of the first magnetization pinned region 13a is pinned. The pinning of the magnetization can be achieved, for example, by using an antiferromagnetic layer 30a laminated on the first magnetization pinned region 13a. A magnetization direction of the second magnetization pinned region 13b is fixed to a second direction (−z direction) opposite to the first direction. The magnetization of the second magnetization pinned region 13b is pinned. The pinning of the magnetization can be achieved, for example, by using an antiferromagnetic layer 30b laminated on the second magnetization pinned region 13b. The magnetization switching region 13c is provided between the first magnetization pinned region 13a and the second magnetization pinned region 13b, and its magnetization can be switched. The lower magnetic layer 11 is provided below the magnetization switching region 13c through the barrier layer 12. The magnetization of the lower magnetic layer 11 is pinned. The pinning of the magnetization can be achieved, for example, by using an antiferromagnetic layer (not shown) laminated under the lower magnetic layer 11. The lower magnetic layer 11, the barrier layer 12 and the magnetization switching region 13c of the upper magnetic layer 13 form magnetic tunneling junction (MTJ).

As described above, the magnetization direction of the first magnetization pinned region 13a is fixed to the +z direction, the magnetization direction of the second magnetization pinned region 13b is fixed to the −z direction and the magnetization direction of the magnetization switching region 13c can be switched (reversed). Accordingly, by the magnetization direction of the magnetization switching region 13c, a domain wall 16 is formed between the first magnetization pinned region 13a and the magnetization switching region 13c, or between the second magnetization pinned region 13b and the magnetization switching region 13c. In other words, when the magnetization direction of the magnetization switching region 13c is the same as the magnetization direction of the first magnetization pinned region 13a, which is the +z direction, the domain wall 16b is formed between the magnetization switching region 13c and the second magnetization pinned region 13b. When the magnetization direction of the magnetization switching region 13c is the same as the magnetization direction of the second magnetization pinned region 13b, which is the −z direction, the domain wall 16a is formed between the magnetization switching region 13c and the first magnetization pinned region 13a.

Since the other function, the material and the configuration of the upper magnetic layer 13 in the present embodiment are similar to those in the first embodiment except that the upper magnetic layer 13 is a rectangular solid which is long in an x direction, description thereof is omitted. Since the barrier layer 12 is similar to the barrier layer in the first embodiment except that the layer 12 is a rectangular plate which is long in the x direction, description thereof is omitted. Since the lower magnetic layer 11 is similar to the lower magnetic layer in the first embodiment except that the layer 11 has a perpendicular magnetic anisotropy in the −z direction, description thereof is omitted. Although the upper magnetic layer 13 and the lower magnetic layer 12 are ferromagnetic layers having the perpendicular magnetic anisotropy in the present embodiment, even when the layers are ferromagnetic layers having the in-plane magnetic anisotropy, the present invention can be similarly implemented.

Next, the writing principle of data to the magnetoresistive element (memory cell) will be described. FIG. 8 is a sectional view showing the writing principle of data to the magnetoresistive element (memory cell) according to second embodiment of the present invention. Data writing is performed according to a domain wall motion method using spin injection. A write current Iw flows in the upper magnetic layer 13 in a planar form, not in the direction of passing through MTJ. The write current Iw is supplied to the upper magnetic layer 13 from a current supply terminal (not shown) connected to the first magnetization pinned region 13a or a current supply terminal (not shown) connected to the second magnetization pinned region 13b. As shown in (a) of FIG. 8, a state where the magnetization direction of the magnetization switching region 13c is parallel to that of the lower magnetic layer 11 is assigned to data "0". In the state of data "0", the magnetization direction of the magnetization switching region 13c is the −z direction. The domain wall 16 (domain wall 16a) exists in a boundary between the magnetization switching region 13c and the first magnetization pinned region 13a. On the contrary, as shown in (c) of FIG. 8, a state where the magnetization direction of the magnetization switching region 13c is antiparallel to that of the lower magnetic layer 11 is assigned to data "1". In the state of data "1", the magnetization direction of the magnetization switching region 13c is the +z direction. The domain wall 16 (domain wall 16b) exists in a boundary between the magnetization switching region 13c and the second magnetization pinned region 13b.

In the state shown in (a) of FIG. 8, in a writing operation of the data "1", a first write current Iw1 is supplied from the current supply terminal, flows from the second magnetization pinned region 13b into the first magnetization pinned region 13a through the magnetization switching region 13c, and then, flows out through the current supply terminal ((b) in FIG. 8). In this case, spin electrons are injected from the first magnetization pinned region 13a to the magnetization switching region 13c. The injected spin electrons drive the domain wall 16a existing in the boundary between the magnetization switching region 13c and the first magnetization pinned region 13a toward the second magnetization pinned region 13b. As a result, the magnetization direction of the magnetization switching region 13c is switched to the +z direction. In other words, due to a spin transfer effect, the magnetization of the magnetization switching region 13c is switched and its magnetization direction varies to the +z direction. Then, the domain wall 16 reaches the boundary between the magnetization switching region 13c and the second magnetization pinned region 13b (domain wall 16b, (c) of FIG. 8).

In a writing operation of the data "0", a second write current Iw2 is supplied from the current supply terminal, flows from the first magnetization pinned region 13a into the second magnetization pinned region 13b through the magnetization switching region 13c and then, flows out through the current supply terminal ((d) of FIG. 8). In this case, spin electrons are injected from the second magnetization pinned region 13b to the magnetization switching region 13c. The injected spin electrons drive the domain wall 16b existing in the boundary between the magnetization switching region 13c and the second magnetization pinned region 13b toward the first magnetization pinned region 13a. As a result, the magnetization direction of the magnetization switching region 13c is switched to the −z direction. In other words, due to the spin transfer effect, the magnetization direction of the magnetization switching region 13c is switched and its magnetization direction varies to the −z direction. Then, the domain wall 16 reaches the boundary between the magnetization switching region 13c and the first magnetization pinned region 13a (domain wall 16a, (a) of FIG. 8).

As described above, the magnetization direction of the magnetization switching region 13c is switched by the write currents Iw1, Iw2 flowing in the upper magnetic layer 13 in a planar way. The first magnetization pinned region 13a and the second magnetization pinned region 13b act as sources for different electrons having different spins. In this case, since the upper magnetic layer 13 is made of a material having the perpendicular magnetic anisotropy, the magnetization direction of each region of the upper magnetic layer 13 with respect to the write currents Iw1, Iw2 is perpendicular. Therefore, magnitude of each of the write currents Iw1, Iw2 can be greatly reduced. It is apparent from the above-mentioned writing principle that overwriting of data (ex.: the data "0" is written onto the data "0") can be achieved.

Next, a reading principle of data from the magnetoresistive element (memory cell) will be described. In a data reading operation, a read current is supplied so as to flow between the lower magnetic layer 11 and the magnetization switching region 13c. For example, the read current is supplied from the current supply terminal (not shown). Then, the read current flows into the lower magnetic layer 11 through the first magnetization pinned region 13a, the magnetization switching region 13c and the barrier layer 12 and flows out through a current terminal (not shown) provided on the lower magnetic layer 11. Alternatively, the read current may flow inversely.

When the data "0" is stored (refer to (a) of FIG. 8), the magnetization direction of the lower magnetic layer 11 is pinned to the −z direction. Similarly, the magnetization direction of the magnetization switching region 13c is the −z direction. In other words, both the magnetization directions are parallel to each other. Accordingly, by passing the read current, a low resistance value, that is, data "0" is read as data in the magnetoresistive element 1a. When the data "1" is stored (refer to (c) of FIG. 8), the magnetization direction of the lower magnetic layer 11 is fixed to the −z direction. The magnetization direction of the magnetization switching region 13c is the +z direction. In other words, both the magnetization directions are antiparallel to each other. Accordingly, by passing the read current, a high resistance value, that is, data "1" is read as data in the magnetoresistive element 1a.

Figure 9:
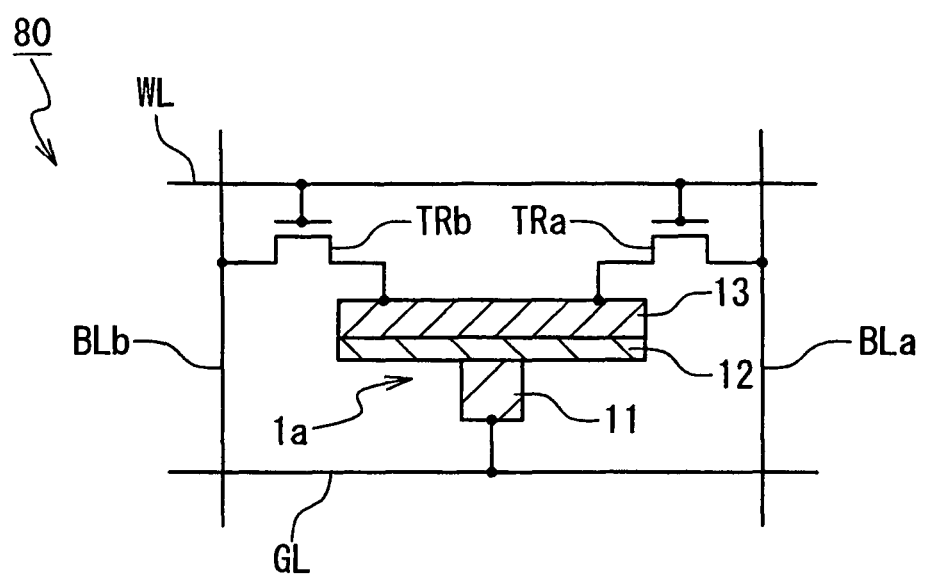
FIG. 9 is a circuit diagram showing an example of a configuration of a memory cell using the magnetoresistive element according to the second embodiment of the present invention.

FIG. 9 is a circuit diagram showing an example of a configuration of a memory cell using the magnetoresistive element according to the second embodiment of the present invention. In the memory cell 80, a terminal connected to the lower magnetic layer 11 in the magnetoresistive element 1a is connected to a ground line GL. A terminal connected to the first magnetization pinned region 13a in the upper magnetic layer 13 is connected to one of a source and a drain of a MOS transistor TRa. The other of the source and the drain of the MOS transistor TRa is connected to a bit line BLa. A gate of the MOS transistor TRa is connected to a word line WL. Similarly, a terminal connected to the second magnetization pinned region 13b in the upper magnetic layer 13 is connected to one of a source and a drain of a MOS transistor TRb. The other of the source and the drain of the MOS transistor TRb is connected to a bit line BLb. A gate of the MOS transistor TRb is connected to the word line WL. However, the configuration of the memory cell is not limited to this example.

Figure 10:
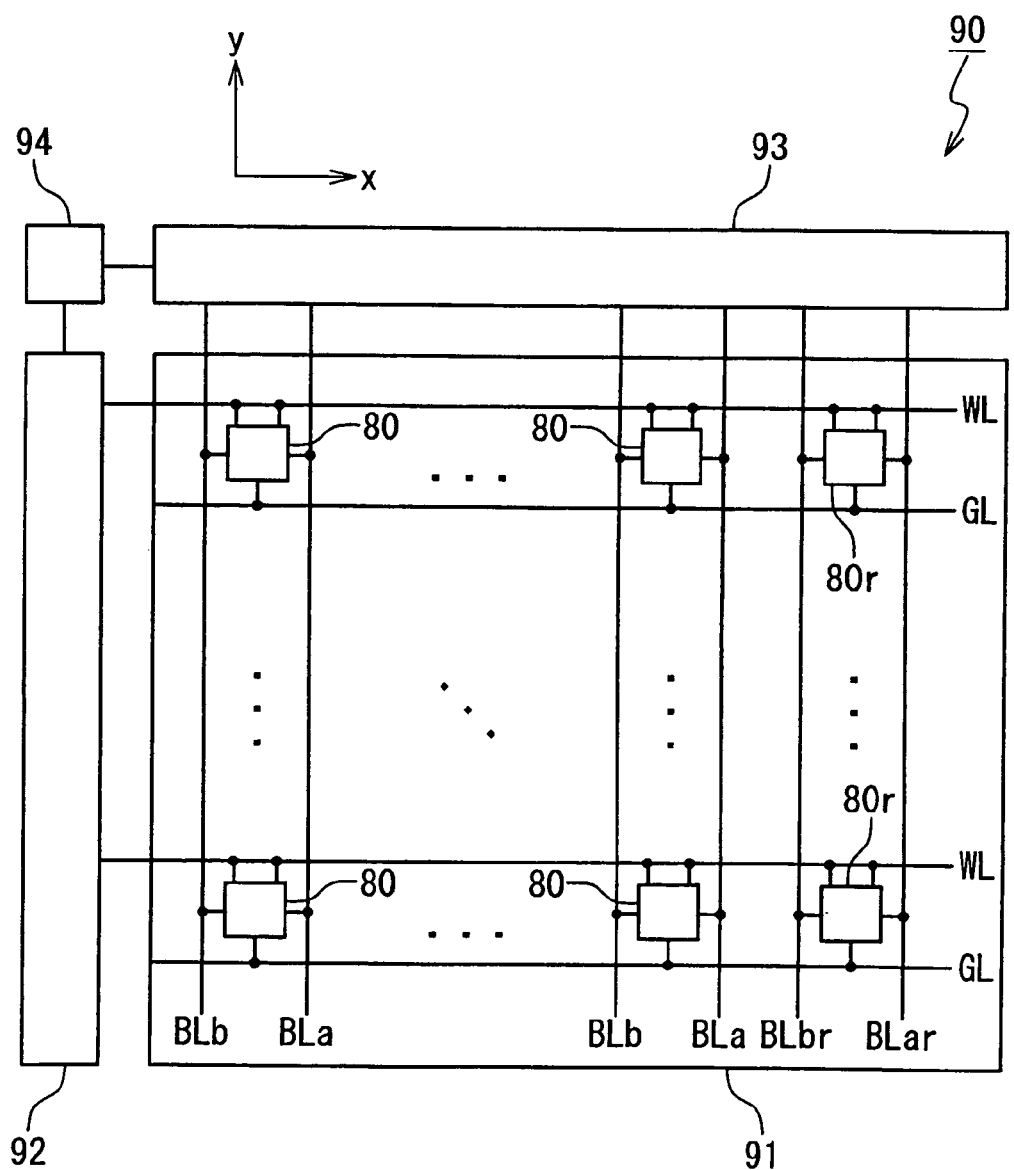
FIG. 10 is a block diagram showing an example of a configuration of an MRAM formed of integrated memory cells according to the second embodiment of the present invention.

FIG. 10 is a block diagram showing an example of a configuration of an MRAM formed of integrated memory cells according to the second embodiment of the present invention. In FIG. 10, the MRAM 90 includes a memory array 91 in which a plurality of memory cells 80 are arranged in a matrix. The memory array 91 includes the memory cells 80 used to record data described referring to FIG. 9 and reference cells 80r referred to during the reading operation. In an example shown in FIG. 10, there is a row of the reference cells 80r. The structure of the reference cell 80r is the same as that of the memory cell 80. In this case, MTJ of the reference cell 80r has a resistance value of R0.5, which is a value intermediate between a resistance value of R0 in the case where the data "0" is stored and a resistance value of R1 in the case where the data "1" is stored. However, two rows of reference cells 80r may be provided; one for the reference cells 80r each having a resistance value of R0 and the other for the reference cells 80r each having the resistance value of R1. In this case, the resistance value of R0.5 is derived from the reference cell 80r having the resistance value of R0 and the reference cell 80r having the resistance value of R1 and used for reading.

The word lines WL and the ground lines GL each extend in an X direction. One end of each word line WL is connected to a X-side control circuit 92. In the data writing and reading operations, the X-side control circuit 92 selects the word line WL connecting the target memory cell 80 as a selected word line WL. The bit lines BLa, BLb each extend in a Y direction. One end of each bit line is connected to a Y-side control circuit 93. In the data writing and reading operations, the Y-side control circuit 93 selects the bit lines BLa, BLb connecting to the target memory cell 80 as selected bit line BLa, BLb. In the data writing and reading operations, the control circuit 94 controls the X-side control circuit 92 and the Y-side control circuit 93.

Next, a reading method and a writing method in the MRAM shown in FIG. 10 will be described.

First, a case where writing is performed will be described. The X-side control circuit 92 selects the selected word line WL. Thereby, the selected word line WL is pulled up to a "high" level and the MOS transistors TRa, TRb are turned "ON". The Y-side control circuit 93 selects the selected bit lines BLa, BLb. Thereby, one of the selected bit lines BLa, BLb is pulled up to "high" level and the other is pulled down to a "low" level. Which of the selected bit lines BLa, BLb is pulled up to the "high" level and which of the selected bit lines BLa, BLb is pulled down to the "Low" level depend on data to be written to the magnetoresistive element 1a in the target memory cell 80. In other words, it is determined depending on the direction of the write current Iw flowing to the upper magnetic layer 13. In this manner, the data "0" can be distinguished from the data "1" in writing. The X-side control circuit 92, the Y-side control circuit 93 and the control circuit 94 for controlling the circuits 92, 93 constitutes a "write current supply circuit" for supplying the write current Iw to the memory cell 80.

Next, a case where reading is performed will be described. The X-side control circuit 92 selects the selected word line WL. Thereby, the selected word line WL is pulled up to the "high" level and the MOS transistors TRa, TRb are turned "ON". The Y-side control circuit 93 selects the selected bit lines BLa, BLb. Thereby, one of the selected bit lines BLa, BLb is pulled up to the "high" level and the other is set to "open" (floating). At this time, the read current flows from one of the selected bit lines BLa, BLb (the bit line at "high" level) to the ground line GL through, for example, the second magnetization pinned region 13b, the magnetization switching region 13c, the barrier layer 12 and the lower magnetic layer 11. The potential of the bit line BL receiving the read current or magnitude of the read current depends on a variation in the resistance value of the magnetoresistive element 1a due to the magnetic resistive effect. Accordingly, by detecting the variation in the resistance value as a voltage signal or a current signal as compared to an output of a reference bit line BLr of the reference cell 80r similarly receiving the read current, high-speed reading can be achieved. The X-side control circuit 92, the Y-side control circuit 93 and the control circuit 94 for controlling the circuits 92, 93 constitutes a "read current supply and sense circuit" for supplying the read current IR to the memory cell 80 and reading data.

Next, since a method of manufacturing the magnetoresistive element according to the second embodiment of the present invention is similar to the method in the first embodiment, description thereof is omitted. Further, by forming a plurality of magnetoresistive elements in a matrix to form memory cells located in a matrix, MRAM according to second embodiment of the present invention can be manufactured.

This embodiment can obtain similar effects to those obtained in first embodiment.

The present invention is not limited to each of the above-mentioned embodiments and apparently, each embodiment can be appropriately modified or changed without departing from the scope and spirit of the invention. In addition, the technique in each embodiment can be applied to the other embodiment as long as a technical inconsistency does not occur.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A magnetoresistive element comprising:
    a lower magnetic layer;
    a barrier layer configured to be provided on said lower magnetic layer; and
    an upper magnetic layer configured to be provided on said barrier layer,
    wherein one of magnetization directions of said lower magnetic layer and said upper magnetic layer is fixed,
    wherein said barrier layer has a first surface which includes a surface contacted with an upper surface of said lower magnetic layer,
    wherein said upper magnetic layer has a second surface which includes a surface contacted with an upper surface of said barrier layer,
    wherein each of said first surface and said second surface is greater than said upper surface of the lower magnetic layer in area,
    wherein the lower magnetic layer is formed on a substrate below the barrier layer and the upper magnetic layer,
    wherein the substrate is larger than the lower magnetic layer in area,
    wherein said lower magnetic layer is embedded in an interlayer insulating layer, and
    wherein said barrier layer is provided to cover said lower magnetic layer and a part of said interlayer insulating layer,
    wherein said interlayer insulating layer includes a silicon nitride film configured to be formed on a side surface of said lower magnetic layer, and
    wherein said interlayer insulating layer includes a laminated layer of the silicon nitride film formed along the side surface of said lower magnetic layer as a sidewall and a top surface of the substrate and an oxide film, the silicon nitride film being formed between the oxide film and the lower magnetic layer, and the silicon nitride film being formed between the oxide film and the substrate.

2. The magnetoresistive element according to claim 1, wherein a shape of said first surface is the same as a shape of said second surface.

3. The magnetoresistive element according to claim 1, wherein a magnetization direction of said lower magnetic layer is fixed,
    wherein said upper magnetic layer includes:
        a first magnetization pinned region,
        a second magnetization pinned region; and
        a magnetization switching region configured to be provided between said first magnetization pinned region and said second magnetization pinned region,
    wherein magnetization of said first magnetization pinned region is pinned in a first direction,
    wherein magnetization of said second magnetization pinned region is pinned in a second direction opposite to said first direction,
    wherein magnetization of said magnetization switching region is capable of switching, and
    wherein said lower magnetic layer is provided below said magnetization switching region through said barrier layer.

4. The magnetoresistive element according to claim 1, wherein at least one of said lower magnetic layer and said upper magnetic layer includes a synthetic ferrimagnetic layer.

5. The magnetoresistive element according to claim 1, wherein a periphery of an upper end of said lower magnetic layer is away from a periphery of a lower end of said barrier layer.

6. The magnetoresistive element according to claim 1, wherein an upper end of the lower magnetic layer is separated from a lower end of the upper magnetic layer by the barrier layer in an x-z plane and a predetermined distance in an x-y plane.

7. The magnetoresistive element according to claim 6, wherein an upper end of the lower magnetic layer is separated from a lower end of the upper magnetic layer by an interlayer insulating layer in addition to the barrier layer to form the predetermined distance in the x-y plane.

8. The magnetoresistive element according to claim 1, wherein the substrate is greater in surface area facing a surface of the lower magnetic layer.

9. A magnetic random access memory comprising:
    a plurality of memory cells configured to be provided in a matrix,
    wherein each of said plurality of memory cells includes a magnetoresistive element,
    wherein said magnetoresistive element includes:
        a lower magnetic layer;
        a barrier layer configured to be provided on said lower magnetic layer; and
        an upper magnetic layer configured to be provided on said barrier layer,
    wherein one of magnetization directions of said lower magnetic layer and said upper magnetic layer is fixed,
    wherein said barrier layer has a first surface which includes a surface contacted with an upper surface of said lower magnetic layer,
    wherein said upper magnetic layer has a second surface which includes a surface contacted with an upper surface of said barrier layer,
    wherein each of said first surface and said second surface is greater than said upper surface of the lower magnetic layer in area, wherein the lower magnetic layer is formed on a substrate below the barrier layer and the upper magnetic layer, wherein the substrate is larger than the lower magnetic layer in area, wherein said lower magnetic layer is embedded in an interlayer insulating layer, and wherein said barrier layer is provided to cover said lower magnetic layer and a part of said interlayer insulating layer, wherein said interlayer insulating layer includes a silicon nitride film configured to be formed on a side surface of said lower magnetic layer, and wherein said interlayer insulating layer includes a laminated layer of the silicon nitride film formed along the side surface of said lower magnetic layer as a sidewall and a top surface of the substrate and an oxide film, the silicon nitride film being formed between the oxide film and the lower magnetic layer, the silicon nitride film being formed between the oxide film and the substrate.

10. The magnetic random access memory according to claim 9, wherein a shape of said first surface is the same as a shape of said second surface.

11. The magnetic random access memory according to claim 9, wherein a magnetization direction of said lower magnetic layer is fixed, wherein said upper magnetic layer includes:

a first magnetization pinned region, a second magnetization pinned region; and a magnetization switching region configured to be provided between said first magnetization pinned region and said second magnetization pinned region, wherein magnetization of said first magnetization pinned region is pinned in a first direction, wherein magnetization of said second magnetization pinned region is pinned in a second direction opposite to said first direction, wherein magnetization of said magnetization switching region is capable of switching, and wherein said lower magnetic layer is provided below said magnetization switching region through said barrier layer.

12. The magnetic random access memory according to claim 9, wherein at least one of said lower magnetic layer and said upper magnetic layer includes a synthetic ferrimagnetic layer.

13. The magnetic random access memory according to claim 9, wherein a periphery of an upper end of said lower magnetic layer is away from a periphery of a lower end of said barrier layer.

14. The magnetic random access memory according to claim 9, wherein the substrate is greater in surface area facing a surface of the lower magnetic layer.

* * * * *